United States Patent [19]

Yoshida et al.

[11] Patent Number: 5,073,942

[45] Date of Patent: Dec. 17, 1991

[54] SOUND FIELD CONTROL APPARATUS

[75] Inventors: Hiroko Yoshida; Mitsuhiko Serikawa; Akihisa Kawamura, all of Hirakata; Masaharu Matsumoto, Katano; Katsuaki Sato, Osaka, all of Japan

[73] Assignee: Matsushita Electric Industrial Co., Ltd., Osaka, Japan

[21] Appl. No.: 645,476

[22] Filed: Jan. 24, 1991

[30] Foreign Application Priority Data

Jan. 26, 1990 [JP] Japan .................................... 2-17343

[51] Int. Cl.[5] .............................................. H03G 3/00

[52] U.S. Cl. ....................................... 381/61; 381/63; 84/630; 84/DIG. 26

[58] Field of Search ..................... 381/61, 62, 63, 123, 381/86; 84/630, 631, 632, DIG. 26

[56] References Cited

U.S. PATENT DOCUMENTS 4,628,789 12/1986 Fujimori .............................. 84/631
4,649,564 3/1987 Barnett ................................. 381/63
4,731,848 3/1988 Kendall et al. ............... 84/DIG. 26
4,937,875 6/1990 Hayashi ................................ 381/63

FOREIGN PATENT DOCUMENTS 2554856 6/1976 Fed. Rep. of Germany ........ 84/631
58-3639 1/1983 Japan .
61-257099 11/1986 Japan .
61-261997 11/1986 Japan .
62-173900 7/1987 Japan .
63-87000 4/1988 Japan .

*Primary Examiner*—Forester W. Isen
*Assistant Examiner*—Sylvia Chen
*Attorney, Agent, or Firm*—Wenderoth, Lind & Ponack

[57] ABSTRACT

A sound field switcher inputs an output sound field signal from a sound field producer. The inputted sound field signal is delayed sequentially by plural delayers, after which they are multiplied by coefficients by plural multipliers, and the multiplied results are all added by an adder. Coefficients stored in an area of a memory indicated by a coefficient counter are read out and set to the plural multipliers. The sound field switcher carries out control of the timing for switching the sound field signal produced by the sound field producer and the timing for the coefficient counter to commence counting. Assuming the time required for switching the sound field to be N sampling periods, in case of carrying out a sound field switching from a sound field A to a sound field B, a sound field switching controller issues an order to the coefficient counter so as to count up one by one from 0 to N, and on each count the coefficients stored in an area of the coefficient memory is set to the multipliers. When the count value of the coefficient counter comes to (N/2) or nearest to (N/2), the sound field switching controller issues an order to the sound field producer to output the sound field signal of the sound field B. When the count value of the coefficient counter comes to N, the switching from the sound field A to the sound field B is completed.

5 Claims, 3 Drawing Sheets

MULTIPLIER TO BE INPUTTED

| DISCRETE TIME n | MULTI-PLIER 91 | MULTI-PLIER 92 | MULTI-PLIER 93 | MULTI-PLIER 94 | MULTI-PLIER 95 | |
|---|---|---|---|---|---|---|
| ⋮ | ⋮ $s_A(n)$ ⋮ | ⋮ $s_A(n-1)$ ⋮ | ⋮ $s_A(n-2)$ ⋮ | ⋮ $s_A(n-3)$ ⋮ | ⋮ $s_A(n-4)$ ⋮ | (a) |
| 0 | $s_A(n)$ | $s_A(n-1)$ | $s_A(n-2)$ | $s_A(n-3)$ | $s_A(n-4)$ | (b) |
| ⋮ | ⋮ | ⋮ | ⋮ | ⋮ | ⋮ | |
| N/2-1 | $s_A(n)$ | $s_A(n-1)$ | $s_A(n-2)$ | $s_A(n-3)$ | $s_A(n-4)$ | (c) |
| N/2 | $s_B(n)$ | $s_A(n-1)$ | $s_A(n-2)$ | $s_A(n-3)$ | $s_A(n-4)$ | (d) |
| N/2+1 | $s_B(n)$ | $s_B(n-1)$ | $s_A(n-2)$ | $s_A(n-3)$ | $s_A(n-4)$ | (e) |
| N/2+2 | $s_B(n)$ | $s_B(n-1)$ | $s_B(n-2)$ | $s_A(n-3)$ | $s_A(n-4)$ | (f) |
| N/2+3 | $s_B(n)$ | $s_B(n-1)$ | $s_B(n-2)$ | $s_B(n-3)$ | $s_A(n-4)$ | (g) |
| N/2+4 | $s_B(n)$ | $s_B(n-1)$ | $s_B(n-2)$ | $s_B(n-3)$ | $s_B(n-4)$ | (h) |
| ⋮ | ⋮ | ⋮ | ⋮ | ⋮ | ⋮ | |
| N | $s_B(n)$ | $s_B(n-1)$ | $s_B(n-2)$ | $s_B(n-3)$ | $s_B(n-4)$ | (i) |

*FIG. 3*

SOUND FIELD CONTROL APPARATUS

BACKGROUND OF THE INVENTION

1. Field of the Invention

The present invention relates to a sound field control apparatus for producing a sound field which gives a listener a realistic feeling, and more particularly to a sound field control apparatus having a sound field switcher for changing one sound field to another.

2. Description of the Prior Art

Recently, there has been developed a sound field control apparatus for use with a visual system. The sound field control apparatus produces a sound field which gives a listener a realistic feeling such as if the listener were in the actual scene displayed on a screen. It has been a conventional practice, for eliminating the discontinuance of the output signal in switching the sound field from a certain sound field A to another sound field B to input the sound field signals of both fields in a sound field switcher, to multiply the sound field signal $S_A$ of the sound field A by a coefficient that starts from 1 and gradually decreases to ultimately 0 and the sound field signal $S_B$ of the sound field B by a coefficient that starts from 0 and gradually increases to ultimately 1 in the sound field switcher, and to output the sum of these multiplied signals.

However, according to the abovementioned sound field switching, two input signals, $S_A$ and $S_B$, are fed to the sound field switcher. In switching a sound field in a sound field producer that produces plural kinds of sound field signals, but is not capable of simultaneously outputting two or more kinds of sound field signals, at least two sound field producers having the same constitution are required. Consequently, the whole constitution of the sound field control apparatus becomes extremely large.

SUMMARY OF THE INVENTION

An object of the present invention is to provide a sound field control apparatus having a sound field switcher which has a single sound field signal input terminal and causes extremely reduced switching noise.

In order to attain the above object, a sound field control apparatus of the present invention comprises a sound field producer for processing a music signal to selectively produce one of plural sound field signals, plural delay circuits for sequentially delaying an output sound field signal of the sound field producer, plural multipliers for multiplying the output sound field signal of the sound field producer and the output signals of the plural delay circuits by specified coefficients, respectively, an adder for adding output signals of the plural multipliers, a coefficient changer for changing the coefficients of the plural multipliers, and a controller for controlling the sound field producer and the coefficient changer. In switching the sound field, the controller controls the sound field producer to switch the output sound field signal of the sound field producer from a first sound signal to a second sound field signal, and on the other hand controls the coefficient changer to change the coefficients of the plural multipliers so that the output signal of the adder is smoothly changed from the first sound field signal to the second sound field signal through a process in which the output signal of the adder contains gradually decreasing first sound field signal and gradually increasing second sound field signal.

The coefficient changer may be comprised by a coefficient memory having stored therein plural sets of coefficients to be set to the plural multipliers in areas arranged in a specified sequence, and a coefficient counter for sequentially selecting the areas in the coefficient memory under control by the controller to change the coefficients of the multipliers.

In a preferred embodiment, a sound field control apparatus comprises a sound field producer for selectively producing one of plural sound field signals, a sound field switching controller for instructing sound field switching of the sound field producer, plural delayers, plural multipliers, an adder, a coefficient memory having stored therein coefficients of the plural multipliers, and a coefficient counter for sequentially drawing out the coefficients from the coefficient memory by counting up or counting down under control by the sound field switching controller.

By the above constitution, in case of switching the sound field from a sound field A to a sound field B, at first, from the sound field producer a sound field signal $S_A$ of the sound field A is outputted, and the count value of the coefficient counter indicates 0 or a specified maximum count value N. In an area of the coefficient memory indicated by the count value of the counter, coefficients containing only one coefficient of 1 and the remaining coefficients of 0 are stored. These coefficients are set to the respective multipliers. The sound field signal $S_A$ outputted from the sound field producer is delayed by the plural delayers connected in series, and the respective output signals of the sound field producer and the plural delayers are multiplied with the plural multipliers in which the abovementioned coefficients are set. A sum of outputs from all the multipliers obtained by the adder is outputted. Namely, from the sound field switcher either the sound field signal $S_A$ or the delayed one of the sound field signal $S_A$ is outputted.

Assuming the time required for the sound field switching to be N sampling periods, simultaneously with the start of the sound field switching, by the control of the sound field switching controller, the coefficient counter increases the count value one by one from 0 to N or decreases the count value one by one from N to 0 in response to each sampling of the signal. The coefficients stored in the coefficient memory are read out according to the count value of the coefficient counter, and set to the respective multipliers.

When the count value of the coefficient counter becomes (N/2) or close to (N/2), by the control of the sound field switching controller a sound field signal $S_B$ of the sound field B comes to be produced from the sound field producer. In other words, during the time when the count value of the coefficient counter is between (N/2) and N, both the sound field signal $S_A$ and the sound field signal $S_B$ are subjected to delays, multiplications with the coefficients and addition to obtain an output signal which contains the sound field signals $S_A$ and $S_B$ mixed at a specified mixing ratio.

When the count value of the coefficient counter becomes N or 0, in an area of the coefficient memory indicated by the count value of the counter, coefficients containing only one coefficient of 1 and the remaining coefficients of 0 are stored. These coefficients are set to the respective multipliers. The sound field signal $S_B$ outputted from the sound field producer is delayed by the plural delayers, and the respective output signals of the sound field producer and the delayers are multiplied by the plural multipliers in which the abovementioned coefficients are set. A sum of the outputs from all the multipliers obtained by the adder is outputted. In other words, from the sound field switcher, either the sound field signal $S_B$ or the delayed one of the sound field signal $S_B$ is outputted. In this manner, switching from the sound field A to the sound field B is carried out smoothly with a single sound field signal input terminal.

As described above, according to the present invention, there is no necessity to provide both of the sound field signals to be switched at all times during the sound field switching, so that sound field switching can be smoothly carried out. Accordingly, by using a sound field producer which cannot output plural sound field signals at a time and subjecting the output sound field signal from the sound field producer to an averaging processing, sound field switching can be carried out with a sound field switcher having a single input terminal without causing switching noise.

BRIEF DESCRIPTION OF THE DRAWINGS:

FIG. 3 is a view showing the change by time of the inputted values to the multipliers 91-95 shown in FIG. 1 and FIG. 2.

DESCRIPTION OF THE PREFERRED EMBODIMENTS

Figure 1:
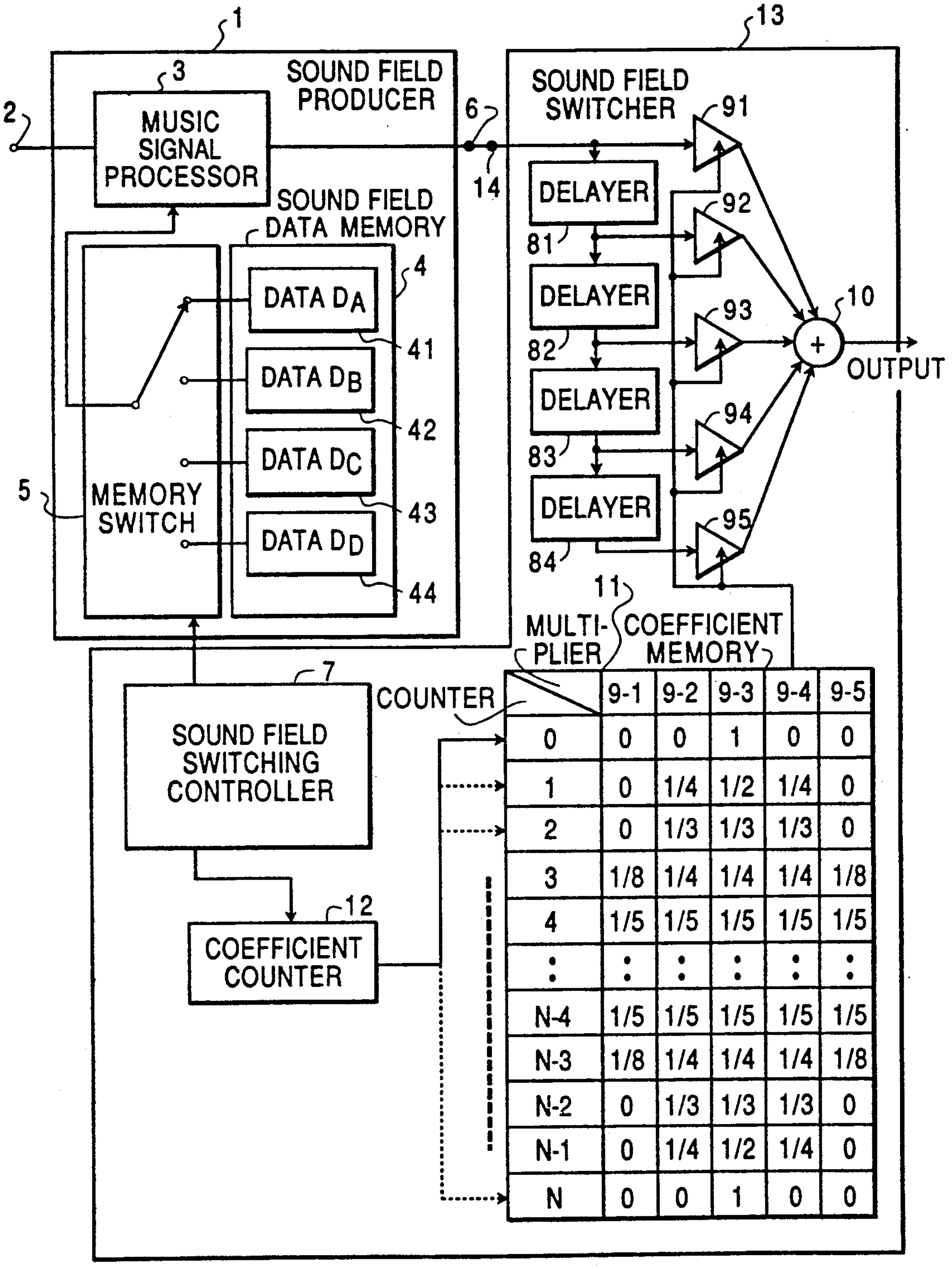
FIG. 1 is a block diagram showing a sound field control apparatus in an embodiment of the present invention.

FIG. 1 is a block diagram of a sound field control apparatus in one embodiment of the present invention. The sound field signals are digital signals. In FIG. 1, a sound field producer 1 for processing music signals to selectively produce any of plural sound fields is constituted by a music signal input terminal 2, a music signal processor 3 for processing a music signal based on a set sound field data, a sound field memory 4 having stored therein plural sound field data, a memory switch 5 for selecting a sound field data to be set to the music signal processor 3, and a sound field signal output terminal 6 for outputting the sound field signal produced in the sound field producer 1. The sound field data memory 4 has the data areas 41, 42. 43 and 44 which have stored therein data $D_A$ of a sound field A, data $D_B$ of a sound field B, data $D_C$ of a sound field C and data $D_D$ of a sound field D, respectively. The sound field switcher 13 comprises a sound field switching controller 7 for controlling the memory switch 5 and a coefficient counter 12, delayers 81-84 each for delaying its input signal by 1 sampling period, multipliers 91-95 for multiplying an input sound field signal to the sound field switcher 13 and output signals of the delayers 81-84 by specified coefficients respectively, an adder 10 for adding output signals of the multipliers 91-95, a coefficient memory 11 having stored therein coefficients to be set to the multipliers 91-95, a coefficient counter 12 for indicating a memory area of the coefficients to be read out from the coefficient memory 11 under control of the sound field switching controller 7, and a sound field signal input terminal 14 for inputting the sound field signal outputted from the sound field producer 1.

FIG. 3 is a view showing the change by time of the input signals to the multipliers 91-95.

Explanation is given on the case of switching the sound field from the sound field A to the sound field B.

The time required for switching the sound field is assumed to be N sampling Periods, and $N>8$. Further, a discrete time n is defined as:

$$n = (\text{time elapsed from start of sound field switching}) / (\text{sampling Period})$$

wherein n is an integer. Namely, the discrete time n becomes 0 at the time of the start of the sound field switching and increases by 1 with the lapse of 1 sampling period thereafter. Until the start of the sound field switching, n takes a negative value. Also, the values of the sound field signals $S_A$, $S_B$, $S_C$ and $S_D$ to be inputted to the sound field signal input terminal 14 in the discrete time n are expressed as $S_A(n)$, $S_B(n)$, $S_C(n)$ and $S_D(n)$, respectively.

During the time until the start of the sound field switching, i.e., when $n<0$, under control of the sound field switching controller 7, the data $D_A$ of the sound field A in the data area 41 of the sound field data memory 4 is selected by the memory switch 5 and set to the music signal processor 3. The music signal inputted to the music signal input terminal 2 is subjected to processing such as convolution by using the data $D_A$ with the music signal processor 3 to become the sound field signal $S_A$ and outputted from the sound field signal output terminal 6, which is inputted to the sound field signal input terminal 14.

The sound field signal $S_A$ inputted to the sound field switcher 13 is delayed sequentially by the Plural delayers 81-84 each by 1 sampling period. During the period until the start of the sound field switching, i.e., when $n<0$, the input sound field signal $S_A$ and the delayed sound field signal S. from the delayers 81-84, respectively, are inputted to the multipliers 91-95. as shown in FIGS. 3, (a) and (b). BY the control of the sound field switching controller 7, the coefficient counter 12 continues to indicate 0, the coefficients 0, 0, 1, 0, 0 are read out from the area indicated by the count value 0 of the counter in the coefficient memory 11, and those coefficients are in a state of being set to the multipliers 91-95, respectively. After multiplying the input signals to the multipliers 91-95 by the coefficients respectively with the multipliers 91-95, addition is performed with the adder 10. In other words, the output signal from the sound field switcher 13 is a signal $S_A(n-2)$ which is the inputted sound field signal $S_A$ delayed by the delayers 81 and 82.

During the time from the start to the end of the sound field switching, i.e. when $0 \leqq n \leqq N$, by the control of the sound field switching controller 7, the count value of the coefficient counter 12 increases by 1 stepwise from 0 up to the specified maximum count value N in response to each sampling of the signal. In other words; from the start to the end of the sound field switching, the value of the discrete time n and the count value of the coefficient counter 12 are in agreement.

During the time from the start of the sound field switching to the time when the discrete time n is less than (N/2), i.e. $0 \leqq n \leqq (N/2)$, the sound field signal $S_A$ continues to be inputted to the sound field signal input terminal 14, and the input sound field signal $S_A$ and the delayed sound field signal $S_A$ from the delayers 81-84, respectively, are inputted to the multipliers 91-95, as shown in FIGS. 3, (b) and (c). When the count value of the coefficient counter 12 is 1, the coefficients 0, $\theta$, $\frac{1}{2}$, $\theta$, 0 are read out from the coefficient memory 11; when the count value is 2, the coefficients 0, $\frac{1}{3}$, $\frac{1}{3}$, $\frac{1}{3}$, 0 are read out from the coefficient memory 11; when the count value is 3, the coefficients $\frac{1}{8}$, $\frac{1}{4}$, $\frac{1}{4}$, $\frac{1}{4}$, $\frac{1}{8}$ are read out from the coefficient memory 11; and when the count value is between 4 and (N–4), the coefficients 1/5, 1/5, 1/5, 1/5, 1/5 are read out from the coefficient memory 11, and set to the multipliers 91–95 respectively as the coefficients thereof. In the same manner as the case where the coefficient counter is 0, the read out coefficients are respectively set to the multipliers 91–95 to be multiplied respectively with the input signals to the multipliers 91–95. The outputs of the multipliers 91–95 are added by the adder 10 to obtain an output sound field signal.

When the discrete time n is (N/2), i.e. when the count value of the coefficient .counter 12 is (N/2), by the control of the sound field switching controller 7, the data $D_B$ of the sound field B in the data area 42 of the sound field data memory 4 is selected by the memory switch 5 and set to the music signal processor 3. The music signal inputted to the music signal input terminal 2 is provided with processing such as convolution processing with the music signal Processor 3 based on the data Ds to become a sound field signal $S_B$ and outputted from the sound field signal output terminal 6, which is inputted to the sound field signal input terminal 14. Thereafter. the sound field signal $S_B$ continues to be inputted until the next sound field switching is carried out.

When the discrete time n is (N/2), the input sound field signal $S_B$ and the delayed sound field signals $S_A$ from the delayers 81–84 are inputted to the multipliers 91–95, as shown in FIG. 3 (*d*).

When the discrete time n is (N/2)+1, the input sound field signal $S_B$ and the sound field signals $S_B$, $S_A$ delayed respectively by the delayers 81–84 are inputted to the multipliers 91–95, as shown in FIG. 3 (*e*).

When the discrete time n is (N/2)+2, the input sound field signal $S_B$ and the sound field signals $S_B$, $S_A$ delayed respectively by the delayers 81–84 are imputed to the multipliers 91–95, as shown in FIG. 3(*f*).

When the discrete time n is (N/2)+3, the input sound field signal $S_B$ and the sound field signals $S_B$, $s_A$ delayed respectively by the delayers 81–84 are inputted to the multipliers 91–95, as shown in FIG. 3(*g*).

When the discrete time n is (N/2)+4 or more, the input sound field signal $S_B$ and the sound field signals $S_B$ delayed respectively by the delayers 81–84 are inputted to the multipliers 91–95, as shown in FIG. 3 (*h*).

Until the count value of the coefficient counter 12 becomes (N−4), the coefficients 1/5, 1/5, 1/5, 1/5, 1/5 continue to be read out from the coefficient memory 11; when the count value of the coefficient counter is (N−3), the coefficients $\frac{1}{8}$, $\frac{1}{2}$, $\frac{1}{2}$, $\frac{1}{2}$, $\frac{1}{8}$ are read out from the coefficient memory 11; when the count value is (N−2), the coefficients 0, $\frac{1}{3}$, $\frac{1}{3}$, $\frac{1}{3}$, 0 are read out from the coefficient memory 11; and when the count value is (N−1), the coefficients 0, $\frac{1}{2}$, $\frac{1}{4}$, $\frac{1}{2}$, 0 are read out from the coefficient memory 11. In the same manner as the foregoing cases, multiplications and addition are carried out with multipliers 91–95 and the adder 10.

When the discrete time n is N, the input sound field signals $S_B$ and the sound field signals $S_B$ delayed respectively by the delayers 81–84 are inputted to the multipliers 91–95, as shown in FIG. 3 (*i*).

When the count value of the coefficient counter 12 is N, the coefficients 0, 0, 1, 0, 0 are read out from the coefficient memory 11, at which time the output signals from the sound field switcher 13 are the signal $S_B(n-2)$ which is the input sound field signal $S_B$ delayed by the delayers 81, 82. By this, the sound field switching from the sound field A to the sound field B is completed.

In the above manner, switching from the sound field A to the sound field B is carried out with a single sound field signal input terminal and smoothly.

After completion of the sound field switching, until the start of the next sound field switching, the sound field signal $S_B$ is inputted to the sound field switcher 13, the coefficient counter 12 takes a count value of N, and the output signal from the sound field switcher 13 is the signal $S_B(n-2)$ which is the input sound field signal $S_B$ delayed by the delayers 81, 82.

When the value of (N/2) is not an integer, an integer value nearest to (N/2) may be substituted for it.

In case of continued switching from the sound field B to the sound field C, the count value of the coefficient counter 12 decreases one by one on each sampling of the signals from N to 0, by the control of the sound signal switching controller 7. When the count value of the coefficient counter 12 is (N/2), or comes to be closest to (N/2), by the control of the sound field switching controller 7, the data $D_C$ of the sound field C in the data area 43 of the sound field data memory 4 is selected by the memory switch 5 and set to the music signal processor 3. The music signal inputted to the music signal input terminal 2 is subjected to processing such as convolution processing based on the data $D_C$ by the music signal processor 3 to become a sound field signal $S_C$. The sound field signal $S_C$ is outputted from the sound field signal output terminal 6, and inputted to the sound field signal input terminal 14. The discrete time n is based on the 0 value of the starting time for the sound field switching from the sound field B to the sound field C. The delays, multiplications and addition of the sound field signals are carried out in the same manner as that when switching is made from the sound field A to the sound field B. Consequently, the switching from the sound field B to the sound field C is carried out by a single sound field signal input terminal and smoothly. Subsequently, sound field swtiching is similarly carried out from the sound field C to the sound field D. Generally, when the count value of the coefficient counter 12 is 0 before the sound field switching, the count value is counted up one by one from the start of the sound field swtiching to the end thereof, and when the count value of the coefficient counter 12 is N before the sound field switching, the count value is counted down one by one from the start of the sound field switching to the end thereof. Under the condition where no sound field switching is carried out, the count value of the coefficient counter 12 is fixed to 0 or N.

Hereinafter, the switching of the sound field by the sound field switcher 13 is shown by the mathematical expressions.

The coefficients to be set to the multipliers 91–95 when the count value of the coefficient counter 12 is j are expressed as:

$$C_j(i)3(0 \leqq j \leqq N,\ 0 \leqq i \leqq 4)$$

and it is assumed that:

$C_j(0)$ is a coefficient of the multiplier 91 in case of the counter value j, $C_j(1)$ is a coefficient of the multiplier 92 in case of the counter value j, $C_j(2)$ is a coefficient of the multiplier 93 in case o the counter value j, $C_j(3)$ is a coefficient of the multiplier 94 in case of the counter value j, and $C_j(4)$ is a coefficient of the multiplier 95 in case of the counter value j.

From the start of the sound field switching to the end thereof, the condition is n=j. Assuming the input sound field signal to the sound field switcher 13 to be $S_I(n)$, the output signal $S_O(n)$ from the sound field switcher 13 is expressed as:

$$S_O(n) = \sum_{i=0}^{4} S_I(n-i) \cdot C_n(i)$$

However, the input signal $S_I(n)$ is:

$$S_I(n) = \begin{cases} S_A(n) & (0 \leqq n < N/2) \\ S_B(n) & (N/2 \leqq n \leqq N) \end{cases}$$

While the numbers o the delayers and multipliers may be optionally selected, it is suitable for the delay time to be delayed by one delayer normally to be equal to the sampling period of the music signal, e.g. (1/44.1) msec., and the time required for signal swtiching to be about 25 msec.

As described above, according to the present embodiment, by the averaging processing with the multipliers and adder, signal swtiching can be carried out with the sound field switcher having a single sound field signal input terminal, and without generating a large switching noise.

As a modified embodiment of this embodiment, the coefficients stored in the coefficient memory 11 may be set such that, when the counter value is near O, greater weights are given to the coefficients of the multipliers closer to the center multiplier, and as the counter value comes close to (N/2), the coefficients are gradually averaged, and that the coefficients for the counter values from (N/2) to N are set to be symmetrical with the coefficients for the counter values from 0 to (N/2). Needless to say, the values of the coefficients to be stored in the coefficient memory 11 are not limited to the values shown in this embodiment.

As another modified embodiment of this embodiment, it may be so set that the coefficient memory 11 may be a memory for the counter valves between 0 to (N/2), and the coefficient counter 12 starts from 0 and increases one by one up to (N/2), turns back at (N/2), and decreases one by one down to 0, thereby carrying out a sound field switching equivalent to this embodiment. Specifications for setting the coefficient memory 11 and the coefficient counter 12 are not limited to those shown in this embodiment.

Figure 2:
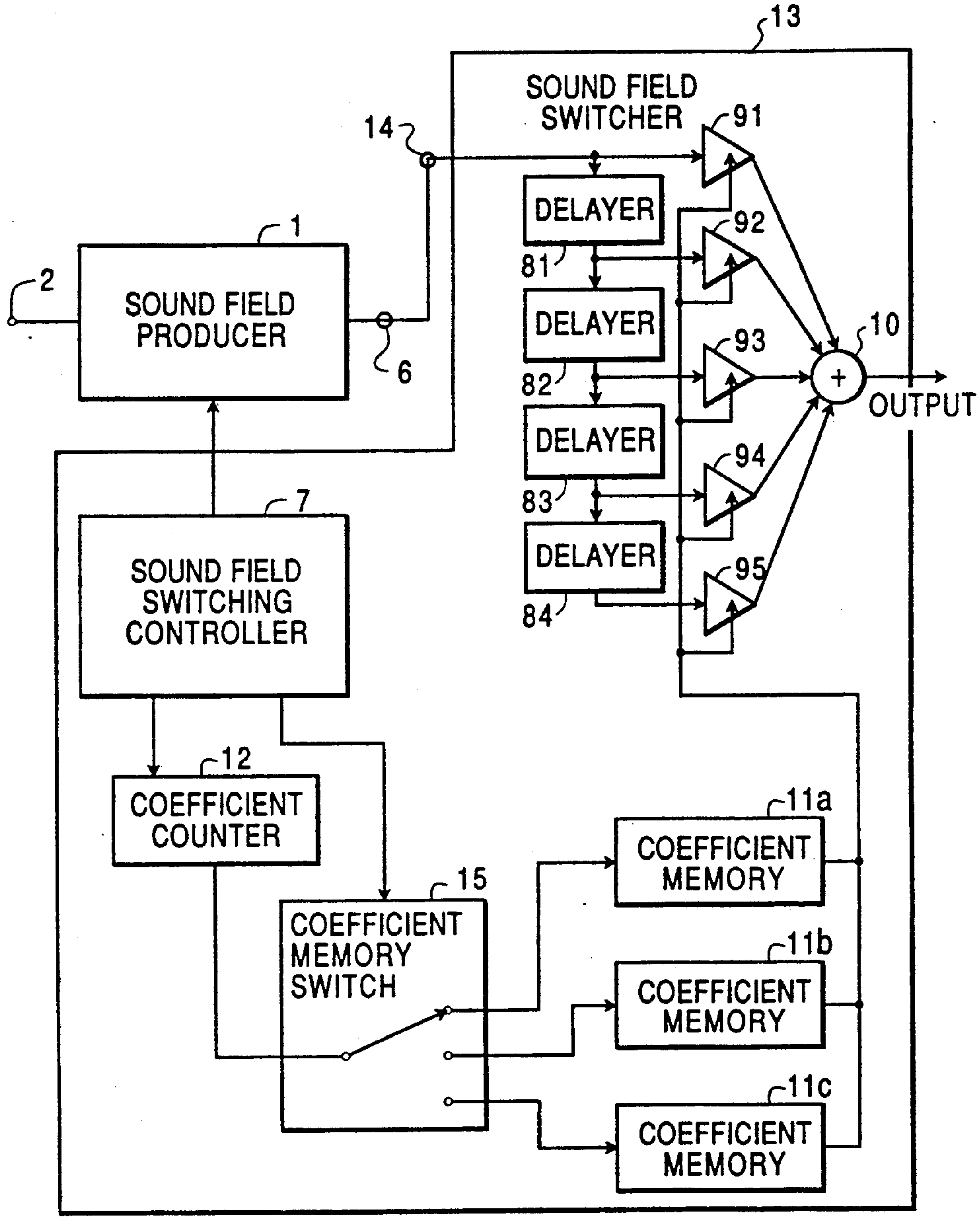
FIG. 2 is a block diagram showing a sound field control apparatus in another embodiment of the present invention.

FIG. 2 is a block diagram of a sound field control apparatus according to another embodiment of the present invention.

In FIG. 2, the sound field producer 1, music signal input terminal 2, delayers 81-84, multipliers 91-95, adder 10 and coefficient counter 12 are respectively the same as those of the embodiment in FIG. 1. In this embodiment, there are plural coefficient memories **11*a*-11*c* and a coefficient memory switch 15 for supplying selectively the output count value of the coefficient counter 12 to any of the plural coefficient memories 11*a*-11*c* under the control of the sound field switching controller 7. The sound field switching controller 7 controls the sound field producer 1, coefficient counter 12 and coefficient memory switch 15**.

In case of switching from the sound field A to the sound field B, at first, a music signal is inputted from the music signal input terminal 2, and the inputted music signal is processed into a sound field signal $S_A$ by the sound field producer 1 under the control of the sound field switching controller 7. The sound field signal $S_A$ is inputted to the sound field switcher 13 through the sound field signal input terminal 14. The inputted sound field signal $S_A$ and the sound field signals $S_A$ delayed by the delayers 81-84 are respectively multiplied by the multipliers 91-95. The results of multiplication are all added by the adder 10 to obtain an output sound field signal. With respect to the coefficients of the multipliers 91-95, only one is a coefficient of 1, and all the rest are the coefficients of 0. As to the output from the sound field switcher 13, either the sound field signal $S_A$ or the slightly delayed sound field signal $S_A$ is outputted.

Simultaneously with the start of the sound field switching, the coefficient memory switch 15 selects, under the control of the sound field switching controller 7, the coefficient memory **11*a* which has stored therein coefficients most suited to the sound field switching from the sound field A to the sound field B out of the coefficient memories 11*a*-11*c*. For example. in the case where the sound field A and the sound field B are the sound fields in which the reverberation time is very short, throughout the counter values from 0 to N, there is selected a coefficient memory having stored therein coefficients in which a larger weight is given to the coefficients of the multipliers positioned close to the center one of the rows of multipliers. Assuming the time required for switching the sound field to be N, under the control of the sound field switching controller 7, the coefficient counter 12 increases the count value one by one from 0 to N by each sampling cycle of the sound field signal. The coefficients stored in an area of the memory 1*a* indicated by each count value of the coefficient counter 12 are set to the multipliers 91-95**.

When the count value of the coefficient counter 12 comes to (N/2) or nearest to (N/2), under the control of the sound field switching controller 7, a sound field signal $S_B$ is produced by the sound field producer 1. The sound field signal $S_B$ is inputted to the sound field switcher 13 from the sound field signal input terminal 14. In the areas of the coefficient memories **11*a*11*c* in which each counter is N, coefficients are so set that only one is the coefficient of 1 and all the rest are the coefficients of 0, As to the output from the sound field switcher 13**, either the sound field signal $S_B$ or the slightly delayed sound field signal $S_B$ is outputted. In this manner, sound field switching from the sound field A to the sound field B is completed.

In case of the switching from the sound field B to the sound field C, the coefficient memory switch 15 selects, under the control of the sound field switching controller 7, the coefficient memory **11*b* which has stored therein coefficients most suited to the sound field switching from the sound field B to the sound field C out of the coefficient memories 11*a*-11*c* to carry out the sound field switching in the same manner as in the case of the switching from the sound field A to the sound field B.Similarly, the coefficient memory 11*c*** is selected in case of switching from other sound field C to the sound field D.

While the numbers of the delayers and multipliers may be optionally selected, it is suitable for the delay time to be delayed by one delayer normally to be equal to the sampling period of the music signal, e.g. (1/44.1) msec., and the time required for signal switching to be about 25 msec.

As described above, according to the present embodiment, by the averaging processing with the multipliers and adder, signal switching can be carried out with the sound field switcher having a single sound field signal input terminal, and without generating a large switching noise. Further, by selecting one of the plural coefficient memories, multiplications and addition can be carried out by using coefficients which are most suited to the sound field switching at that time, so that the switching noise can be further reduced.

As a modified embodiment of this embodiment, the coefficients stored in each of the coefficient memories 11a–11c may be set such that, when the counter value is near 0, greater weights are Given to the coefficients of the multipliers located closer to the center multiplier, and as the counter value comes close to (N/2), the coefficients are gradually averaged, and that the coefficients for the counter values from (N/2) to N are set symmetrical with the coefficients for the counter values from 0 to (N/2).

As another modified embodiment of this embodiment, each of the coefficient memories 11a–11c may be a memory for the counter coefficient of from 0 to (N/2), and the coefficient counter 12 starts from 0 and increases one by one up to (N/2), turns back at (N/2), and decreases one by one down to 0, thereby carrying out sound field switching equivalent to this embodiment.

What is claimed is:

1. A sound field control apparatus comprising:

a sound field producer for processing a music signal to selectively produce one of plural sound field signals;

plural delayers for sequentially delaying an output sound field signal of the sound field producer;

plural multipliers for multiplying the output sound field signal of the sound field producer and output signals of the plural delayers by specified coefficients, respectively;

an adder for adding output signals of the plural multipliers;

a coefficient changer for changing the coefficients of the plural multipliers; and a controller for controlling the sound field producer and the coefficient changer, wherein, when switching a sound field, the controller controls the sound field producer to switch the output sound field signal of the sound field producer from a first sound field signal to a second sound field signal, and also controls the coefficient changer to change the coefficients of the plural multipliers so that an output signal of the adder is smoothly changed from the first sound field signal to the second sound field signal through a process in which the output signal of the adder gradually decreases the first sound field signal and gradually increases the second sound field signal.

2. An apparatus according to claim 1, wherein the coefficient changer comprises:

a coefficient memory having plural sets of coefficients, to be sent to the plural multipliers, stored in areas arranged in a specified sequence; and a coefficient counter for sequentially selecting, under control of the controller, one of the areas of the coefficient memory to change the coefficients of the multipliers.

3. An apparatus according to claim 1, wherein the coefficient changer comprises:

plural coefficient memories each having plural sets of coefficients, to be sent to the plural multipliers, stored in areas arranged in a specified sequence; a memory selection means for selecting one of the plural coefficient memories under control of the controller; and a coefficient counter for sequentially selecting, under control of the controller, one of the areas of the coefficient memory selected by the memory selection means to change the coefficients of the multipliers.

4. An apparatus according to claim 1, wherein the controllers controls the coefficient changer so that, when the sum of the coefficients of the plural multipliers is assumed to be 1, at the start of sound field switching, the coefficient of a specified multiplier out of the plural multipliers is set to be 1 and the coefficients of the other multipliers to be 0, thereafter the coefficients are changed in such a manner that the coefficients are distributed on an average to the plural multipliers, thereafter changed in the reverse direction thereto, and, at the completion of the sound field switching, the coefficient of the specified multiplier becomes 1 and the coefficients of the other multipliers become 0.

5. An apparatus according to claim 4, wherein the controller controls the sound field producer so that, at nearly an intermediate point in time from the start of the sound field switching to the end of the sound field switching, the sound field producer switches the sound field signal from the first sound field signal to the second sound field signal.

* * * * *